Figure 1:
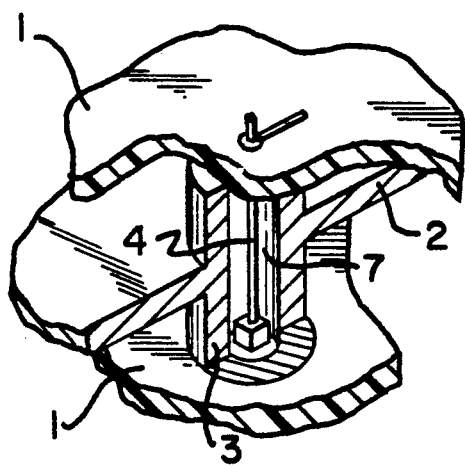

United States Patent [19]
Halttunen et al.

[11] Patent Number: 5,253,146
[45] Date of Patent: Oct. 12, 1993

[54] EARTHED INTERMEDIATE FRAME FOR CIRCUIT BOARDS

[75] Inventors: Mikko Halttunen, Oulu; Petteri Vanhanen, Jääli, both of Finland

[73] Assignee: Nokia Mobile Phones Ltd., Salo, Finland

[21] Appl. No.: 804,226

[22] Filed: Dec. 5, 1991

[30] Foreign Application Priority Data

Dec. 13, 1990 [FI] Finland .................................. 906149

[51] Int. Cl.$^5$ ............................................. H05K 1/14
[52] U.S. Cl. ................................. 361/784; 174/35 R; 257/686; 439/108; 361/744; 361/760; 361/816
[58] Field of Search ............... 361/394, 396, 397, 398, 361/399, 400, 401, 412, 413, 414, 415, 424; 174/35 R, 51; 439/108, 109; 357/71, 74; 257/686, 659, 776

[56] References Cited

U.S. PATENT DOCUMENTS 4,747,019  5/1988  Ito et al. ..................... 361/424

FOREIGN PATENT DOCUMENTS 0371708  6/1990  European Pat. Off. .
254785  3/1988  German Democratic Rep. .
1088408  10/1967  United Kingdom .

*Primary Examiner*—Leo P. Picard
*Assistant Examiner*—Young S. Whang
*Attorney, Agent, or Firm*—Darby & Darby

[57] ABSTRACT

An earthed intermediate frame (2) fitted between circuit boards (1) is provided with through apertures (8) for connectors (4) connecting the circuit boards (1), and grooves (6) are provided in register with the signal runs (5) on the surface of the circuit board (1), located on the surface of the intermediate frame (2) placed against the surface of the circuit board. The intermediate frame made of a metal or the surfaces of the apertures (8) surrounding the connectors (4) connecting the circuit boards (1) and of the grooves (6) covering the signal runs (5) of the circuit board (1) have been coated with an earthed metal folio (7).

8 Claims, 1 Drawing Sheet

EARTHED INTERMEDIATE FRAME FOR CIRCUIT BOARDS

The present invention relates to an earthed (grounded) intermediate frame to be fitted between circuit boards.

It is known in the art to join circuit boards together with earthed metallic intermediate frames fitted therebetween for example so that two circuit boards are joined with a metal frame disposed therebetween into a box-like structure, in which the earth (ground) folios each circuit board constitute the opposite outer surfaces of said box-like structure, whereas the metallic intermediate frame forms its sides. In this manner, the signal conductors of the circuit boards remaining inside said box-like structure and the connectors connecting the circuit-boards are shielded, not only against external interferences but also against causing interference to the environment. The signal conductors and connectors remaining thereinside are not, however, prevented by this kind of structure from causing mutual interference unless said connectors and conductors are separately shielded by coating said connectors and conductors with an earthed sheath. Such separate shielding will however become expensive and particularly the signal conductors on the surface of the circuit boards are difficult to protect in this manner.

The object of the present invention is therefore to provide an earthed intermediate frame to be fitted between said circuit boards, which not only shields the signal conductors on the surface of the circuit boards and the connectors connecting the circuit boards against external interferences and against causing interference to the environment but also prevents the signal conductors on the surfaces of the circuit boards and the connectors connecting said circuit boards joined by the intermediate frame from causing mutual interference so that no separate shielded connectors or signal conductors be needed for said purpose.

The intermediate frame according to the present invention is provided with through apertures or substantially transversal sleeves for connectors connecting circuit boards, and/or grooves in register with the signal runs located on the surface of the circuit boards on the surface of the intermediate frame placed against said surface of the circuit board. By means of the intermediate frame according to the invention the signal conductors on the surface of the circuit boards joining it and the connectors connecting said circuit boards can be shielded, not only against the external interferences of the structure constituting the intermediate frame for joining them but also against the mutual interfering influences caused by said signal conductors and connectors, not having to resort to separate shielding of the signal conductors or connectors.

The intermediate frame according to the invention may be made entirely of a metal or e.g. of plastic, whereby the inner faces of the grooves at the signal runs thereof and of the apertures around the connectors, or of the substantially transversal sleeves have been coated by earthed metal folio. Said metal folios form preferably a uniform earth folio.

Figure 2:
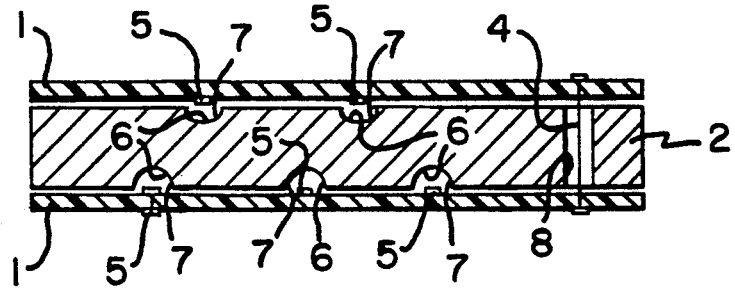
Figure 3:
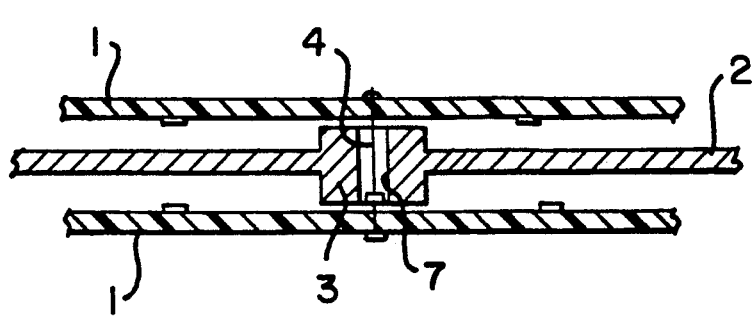

The invention is described below more closely, reference being made to the accompanying drawing, in which:

FIG. 1 presents a cross-sectional perspective partial view of the frame structure according to the invention, fitted between two circuit boards, and FIG. 2 presents a longitudinal section of an alternative intermediate frame according to the invention, likewise fitted between two circuit boards.

In FIG. 1 the circuit boards are generally indicated by reference numeral 1 and the intermediate frame fitted therebetween generally by reference numeral 2. As is seen in FIG. 1, the intermediate frame 2 is provided with a sleeve 3 extending on opposite sides substantially rectangularly, positioned at the connectors 4 connecting the circuit boards 1 so that each connector 4 is surrounded by a sleeve 3 of the intermediate frame 2 which at the same time keeps the circuit boards 1 spaced from one another. The intermediate frame 2 or at least its sleeves 3 may be made of a metal, so that the intermediate frame, or at least its sleeves 3, are earthed. Alternatively, the inside face of the sleeve 3 may be coated with an earth folio 7, which may be combined to the earth folio of one or both of the circuit boards 1, said folio being located on the outer face of the structure. In this case the intermediate frame may be e.g. of plastic.

In the embodiment presented in FIG. 1, the circuit boards 1 are fitted with the earth folios thereof placed outwards on the opposite sides of the planar intermediate frame 2 to form a sandwich structure. Both of the opposite surfaces of the intermediate frame 2 placed against the circuit boards 1 are provided with grooves 6 in register with the signal conductors 5 on the opposite surfaces of the circuit board 1. In addition, the plate-like intermediate frame 2 is provided with through apertures 8 in register with the connectors 4 connecting the circuit boards 1. The plate-like intermediate frame 2 can be made entirely of a metal and be earthed for isolating the connectors 4 and signal conductors 4, not only from the environment but also from each other. Alternatively, the plate-like intermediate frame 2 can be made of a non-conducting material, such as plastic, whereby the surfaces of the apertures 8 and the grooves 6 are coated with a metal folio to be earthed. The metal folios coating the inner surfaces of the grooves 6 and apertures 4 may form a uniform earth folio, this being preferably connected to the earth folio at least of the other circuit board 1.

The embodiments presented in the drawing represent only a few of the examples of the numerous embodiments of the intermediate frame of the present invention. It is also obvious that more than two circuit boards are connectable with intermediate frames fitted therebetween into a multiple-layered structure in which the earth folios of the outer circuit boards are located on the outer surface of said structure.

We claim:

1. An interference shield comprising a grounded intermediate frame for fitting between circuit boards, said grounded intermediate frame having at least one of
   (a) through apertures for connectors connecting said circuit boards,
   (b) substantially transverse sleeves surrounding the through apertures for connectors connecting the circuit boards, and
   (c) grooves for registering with signal runs on at least one surface of said circuit boards, said grooves being located on a surface of the grounded intermediate frame, which intermediate frame surface is for placement against said at least one surface of the circuit board.

2. The interference shield as in claim 1, wherein said grounded intermediate frame is coated with a single ground folio, said folio at least covering inner surfaces of said apertures, sleeves and grooves.

3. An interference shield for use with a first circuit board and a second circuit board, each of said circuit boards having a signal run on a first surface thereof, comprising:
 an intermediate frame having a first surface and a second surface for positioning adjacent to and generally parallel to said first surfaces, respectively of said first and second circuit boards, at least said first surface of said intermediate frame having a groove formed therein in a pattern providing registry with at least a portion of said signal run on said first circuit board when the intermediate frame is positioned next to said first circuit board;
 means on said intermediate frame for connecting with an electrical ground, and for shielding at least portions of said first surfaces of said first and second circuit boards when said first surface and second surface of said intermediate frame and said first surfaces of said first and second circuit boards are respectively next to each other; and
 an aperture in said first surface of said intermediate frame, said aperture extending through said intermediate frame to said second surface on said intermediate frame, said aperture being dimensioned for passing a connector therethrough from said first circuit board to connect with said second circuit board;
 said means for connecting with the electrical ground including a conductive interior surface of said aperture for shielding the connector that connects the two circuit boards when said connector is passed through said aperture.

4. The interference shield as in claim 3, wherein said means for connecting to said electrical ground is a metallic layer formed on said intermediate frame and covering at least the interior surfaces of said groove so as to surround and shield at least said portion of said signal run in registry with said groove.

5. The interference shield as in claim 4, wherein said metallic layer is a coated folio.

6. The interference shield as in claim 3, wherein said groove in said intermediate frame is coated with a metallic folio.

7. The interference shield as in claim 3, wherein said intermediate frame is electrically conductive and said means for connection to the electrical ground joins said frame to an electrical ground on at least said first circuit board when the intermediate frame is positioned next to said first circuit board.

8. The interference shield as in claim 3, further comprising a sleeve integral with and elevated above at least said first frame surface, said aperture in said frame being in alignment with a central opening of said sleeve, whereby at least said first surface of said frame is separated from said first surface of said first circuit board, and a connector extends between said two circuit boards by passing through said sleeve and aperture.

* * * * *